US009246477B2

(12) United States Patent
Li et al.

(10) Patent No.: US 9,246,477 B2
(45) Date of Patent: Jan. 26, 2016

(54) SYSTEMS AND METHODS FOR COMMON MODE LEVEL SHIFTING

(71) Applicant: QUALCOMM Incorporated, San Diego, CA (US)

(72) Inventors: Miao Li, San Diego, CA (US); Xiaohua Kong, San Diego, CA (US); Zhi Zhu, San Diego, CA (US); Jie Xu, San Diego, CA (US)

(73) Assignee: QUALCOMM Incorporated, San Diego, CA (US)

( * ) Notice: Subject to any disclaimer, the term of this patent is extended or adjusted under 35 U.S.C. 154(b) by 37 days.

(21) Appl. No.: 14/228,049

(22) Filed: Mar. 27, 2014

(65) Prior Publication Data

US 2015/0280695 A1    Oct. 1, 2015

(51) Int. Cl.
*H03K 19/0175* (2006.01)
*H03K 3/356* (2006.01)

(52) U.S. Cl.
CPC .................................. *H03K 3/35613* (2013.01)

(58) Field of Classification Search
USPC .......................... 327/306, 309; 326/63, 80–81
See application file for complete search history.

(56) References Cited

U.S. PATENT DOCUMENTS

| 6,002,299 A | 12/1999 | Thomsen |
| 6,624,698 B2 * | 9/2003 | Nagaraj ........................ 330/258 |
| 6,693,489 B2 | 2/2004 | Cherry et al. |
| 7,948,270 B1 | 5/2011 | Evans et al. |
| 8,320,847 B2 | 11/2012 | Weber et al. |
| 8,441,287 B2 * | 5/2013 | Chatterjee et al. .............. 327/94 |
| 2013/0147548 A1 | 6/2013 | Ikeda |

FOREIGN PATENT DOCUMENTS

WO    WO-03061118 A1    7/2003

OTHER PUBLICATIONS

Partial International Search Report—PCT/US2015/019254—ISA/EPO—Aug. 3, 2015.
International Search Report and Written Opinion—PCT/US2015/019254—ISA/EPO—Nov. 12, 2015.

* cited by examiner

*Primary Examiner* — An Luu
(74) *Attorney, Agent, or Firm* — Haynes and Boone LLP

(57) ABSTRACT

A common mode voltage level shifting circuit including: input nodes configured to receive a differential signal with a first common mode voltage, a pair of shunt capacitors coupled between the input nodes and a corresponding pair of output nodes, a threshold voltage circuit, including the output nodes, coupled to the differential signal though the shunt capacitors, the threshold voltage circuit configured to provide a second common mode voltage for the differential signal at the output nodes, and current sources that are controlled according to a level of the first common mode voltage, the current sources coupled to the output nodes to effect the second common mode voltage.

30 Claims, 4 Drawing Sheets

SYSTEMS AND METHODS FOR COMMON MODE LEVEL SHIFTING

TECHNICAL FIELD

This application relates to voltage control, and more particularly, to common mode voltage level shifting.

BACKGROUND

In differential signaling it is conventional to convert from a low-common mode voltage domain to a high-common mode voltage domain. For example, a receiver may use a differential pair of NMOS transistors that require a relatively-high common mode voltage. But the transmitter, or other component of the system, may be using a low-common mode voltage.

For instance, in some high-speed wireline applications, receiver input signals are terminated at a low common mode voltage level, such as 0V or hundreds of mV. To further process the high-speed signal (e.g., 6-10 Gb/s), NMOS differential pairs are generally preferred over PMOS due to lower parasitics, though some applications use PMOS. A conversion buffer is used to convert the low common mode voltage high-speed signal to a high common mode voltage level.

To perform the level shifting to the high-common mode domain it is conventional to receive each differential input signal through a shunt capacitor. For example, one differential input signal may be denoted as rxinp (receiver input positive) whereas the complementary differential input signal may be denoted as rxinn (receiver input negative). Rxinp would be received through a shunt capacitor. Similarly, rxinn would also be received through a shunt capacitor. The shunt capacitors block the received common mode voltage such that the received signals are then boosted using, e.g., a voltage divider to provide the desired relatively-high common mode voltage. But such an arrangement generally only works for relatively high frequency differential signals. As the input frequency is reduced, the shunt capacitors would not only block the received common mode voltage but also the Alternating Current (AC) portion of the signal as well. Such a conventional level shifting arrangement is thus not suitable for some wideband applications.

There is thus a need in the art for improved common mode level shifters that work in both the low and high frequency domains (wideband operation).

SUMMARY

Circuits for level shifting a common mode voltage are provided. In one example, a circuit provides level shifting differential input signals to a pair of output nodes through shunt capacitors such that the output differential voltage across the output nodes has a common mode voltage equaling a threshold voltage of a threshold-voltage-producing device. The output nodes are driven by current sources that are inversely controlled in a feed-forward fashion from the common mode voltage of the differential input signals.

In one embodiment, operation of the circuit includes driving the gates of a pair of PMOS transistors with differential input voltages, respectively, while coupling each differential input voltage to the source of its respective PMOS transistor through a capacitor. Operation of the circuit also includes controlling a current driven through each PMOS transistor inversely to a common mode voltage for the differential input voltages.

In another embodiment, operation of the circuit includes driving the sources of a pair of NMOS transistors with differential input voltages while coupling each component of the differential input voltage to the drain of its NMOS transistor through a capacitor. Operation of the circuit also includes controlling a current driven through each NMOS transistor inversely to a common mode voltage for the differential input voltages.

Various embodiments provide one or more advantages over conventional solutions. For instance, the feed-forward controlled current sources provide reliable level shifting of the common mode voltage, allowing an application to receive a signal with a higher or lower common mode voltage. Also, the AC components of the differential signal—the portions carrying information—modulate the voltage of the output nodes, even at lower frequencies, by driving ports of output transistors. Thus, various embodiments may be employed in wideband applications. These and other advantages may be better appreciated by the detailed description below.

DETAILED DESCRIPTION

Before discussing various embodiments, an explanation of some concepts may assist in understanding the examples below. Differential signaling includes transmitting information over two paired conductors, where the component on one conductor is complementary to the component on the other conductor. Thus, the two complementary components of a differential signal are often referred to as plus and minus signals. Conventional differential signaling receivers detect the difference in the two complementary signals.

Differential signaling can be advantageous for high-speed data, as opposed to single-ended signaling such as where a signal is referenced to ground. For instance, with single-ended signaling the transmission line is subjected to noise such as when transistors adjacent to the transmission line switch state. A single-ended receiver can thus be fooled by the noise and make a bit error. But in differential signaling, the noise affects the plus signal and the minus signal equally (or at least close to equally), and a conventional receiver will omit the noise when it detects the difference between the plus and minus signals.

The common mode voltage includes a component of the differential signal that is present with one sign on both conductors of the conductor pair. The common mode voltage is one-half of the vector sum of the voltages of each conductor. The common mode voltage is given by Equation 1, where V1 is a voltage of one conductor, and V2 is a voltage of the other conductor:

$$V\text{com} = (V1 + V2)/2 \qquad \text{(Eq. 1)}$$

Figure 1:
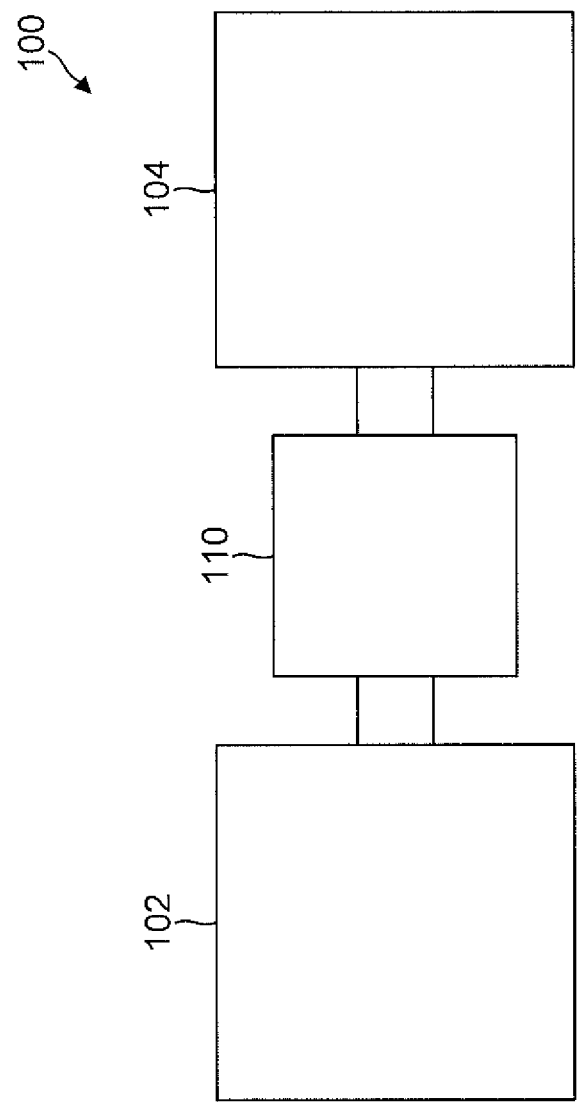
FIG. 1 illustrates an example system having a voltage level shifting circuit in accordance with an embodiment of the disclosure.

FIG. 1 shows an example application 100 for a level shifting circuit 110, according to one embodiment. The system of FIG. 1 includes circuit 102, which operates a relatively low common mode voltage, such as hundreds of mV or so. Circuit 104 operates at a relatively high common mode voltage, such as VDD/2 or so. Of course, the examples given for common mode voltages are for ease of explanation only, and it is understood that the various embodiments may operate at any appropriate common mode voltage.

An example of circuit 102 includes a circuit in a data receiver that terminates the signals at or near 0V, and an example of circuit 104 includes another part of the RF receiver circuit that uses NMOS transistors (not shown here) in a differential pair to receive the signal with a higher common mode voltage around VDD/2. In circuit 104, one NMOS transistor receives the plus signal on its gate, whereas the other NMOS transistor receives the minus signal on its gate. The differential pair steers a tail current responsive to the differential input. As the positive input goes above VDD/2, the corresponding NMOS conducts virtually all the tail current. As the negative input goes above VDD/2, the corresponding NMOS conducts virtually all the tail current. With the common mode at VDD/2, the differential pair is thus in equipoise and can make a rapid bit decision Circuit 110 includes a level shifting circuit for the common mode voltage. Specifically, circuit 110 receives the differential signal from circuit 102 and shifts the common mode voltage up to a level compatible with that of circuit 104. Circuit 110 preserves the AC component of the differential signal over a wide spectrum of frequencies, as explained below. While the example above describes the level shifting circuit 110 used in an RF receiver, it is understood that various embodiments may be used in any of a variety of other applications where a common mode voltage is shifted.

These concepts and features may be better appreciated by the following discussion of example embodiments.

Example Circuit Embodiments

Various embodiments are directed to common mode level shifting circuits that are applicable in devices that have wideband operation. To provide wideband operation, the received differential signals are passed through shunt capacitors to output nodes analogously as discussed above for conventional solutions. But the common mode voltage is controlled through feed-forward control of current sources that drive the output nodes inversely through respective current paths in response to the common mode voltage for the differential input signals. As the common mode voltage for the differential input signal rises, the inverse feed-forward control of the current sources reduces the current driven through current paths driving the output nodes. Conversely, if the common mode voltage for the differential input signals drops, the inverse feed-forward control of the current sources increases the current driven through the current paths driving the output nodes.

Each output node couples to a threshold-voltage device that maintains the output node at a threshold voltage higher than the respective input node voltage. Since the shunt capacitors block any input common mode voltage from passing, the common mode voltage for the output differential voltages (which may be designated as eqinp and eqinn) equals the threshold voltage for the device. The AC portion of the differential signal is applied to the output nodes on paths that avoid the shunt capacitors, thereby preserving the AC information even at lower frequencies.

Figure 2:
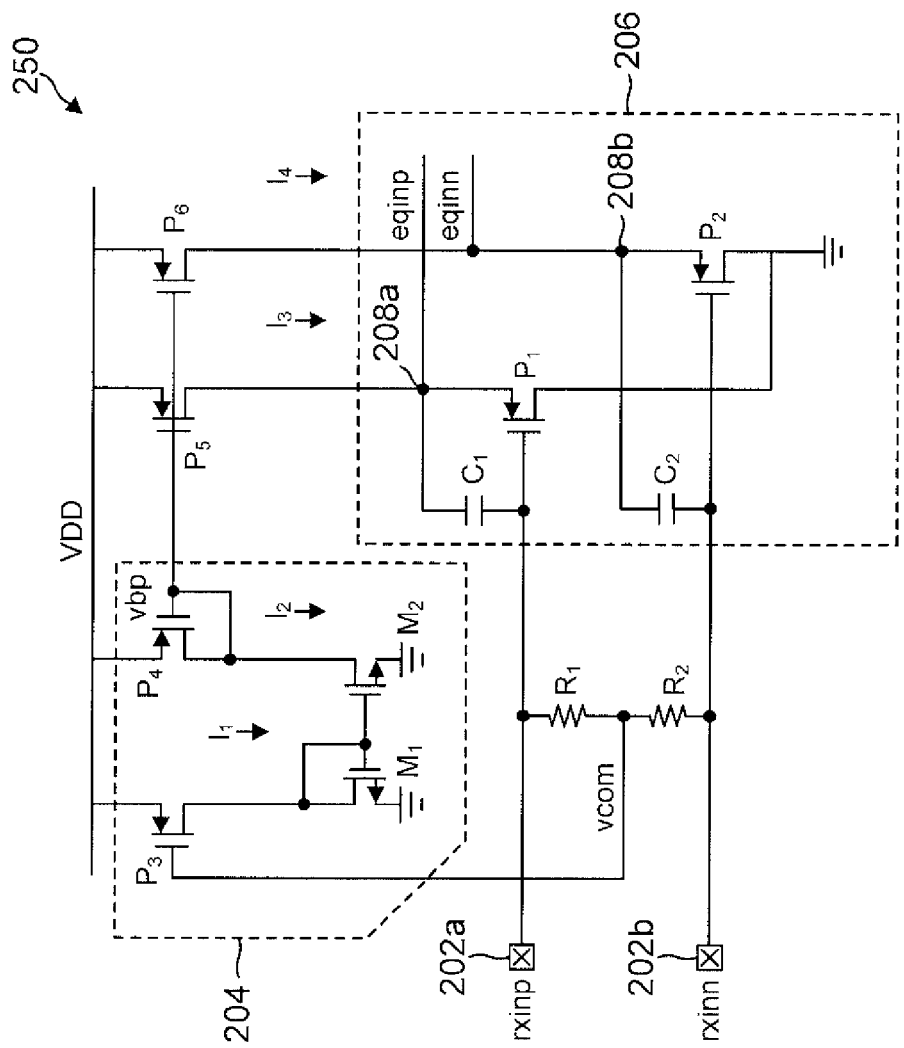
FIG. 2 illustrates an example architecture for a common mode voltage level shifting circuit in accordance with an embodiment of the disclosure.

Turning now to the drawings, FIG. 2 illustrates level shifting circuit 250 adapted according to one embodiment. Circuit 250 may be used as a level shifting circuit 110 in the architecture of FIG. 1.

Circuit 250 includes input nodes 202, receiving a differential signal, where the plus and minus components of the differential signal are given as rxinp and rxinn, respectively. Resistors R1 and R2 act as a voltage divider to provide the input common mode voltage, Vcom, to current source 204. Circuit 250 also includes threshold voltage circuit 206, which sets the output common mode voltage for the differential signal at the output of circuit 250. Threshold voltage circuit 206 receives the input differential signal at the gates of PMOS transistors P1 and P2 and also at output nodes 208 via shunt capacitors C1 and C2. The plus and minus components of the level-shifted differential signal are given as eqinp and eqinn. Operation of the circuit 100 is described in more detail below.

The output nodes 208 are the sources of transistors P1 and P2. The positive differential input signal rxinp directly drives the gate of P1 and also drives its source through shunt capacitor C1. Similarly, the negative differential input signal rxinn directly drives the gate of P2 and also drives P2's source through shunt capacitor C2. For a high-frequency input signal, one can thus, see that the AC portions of the input signals rxinp and rxinn will pass through the shunt capacitors to the sources of P1 and P2, respectively. Eqinp is the positive differential output voltage at the source of P1, and eqinn is the negative differential output voltage at the source of P2.

Turning to the various current sources of circuit 250, it is noted that both transistors P5 and P6 drive currents through threshold voltage circuit 206. Transistors P5 and P6 are both connected through their gates to the gate of transistor P4. Transistor P4 is part of current source 204, as explained in more detail below.

Current source PMOS transistor P5 drives the source of transistor P1, and a current source PMOS transistor P6 drives the source of transistor P2. These current source transistors P5 and P6 are controlled in a feed-forward fashion through the PMOS transistor P3. The gate of transistor P3 is tied to the common mode input voltage Vcom. A current I1 generated by transistor P3 will thus be inversely related to Vcom. As Vcom rises, I1 falls. But if Vcom falls, I1 rises. The current I1 is mirrored through NMOS transistors M1 and M2 as well as the PMOS transistor P4 to control P5 and P6 so that I1 is driven through P1 and P2. Thus, transistors P5 and P6 act as current sources as well.

Of course, the values of I2, I3, and I4 may not be the same as that of I1, though they may be the same in some embodiments. The values of the currents I1, I2, I3, and I4 depend on the properties of the various transistors P3, P4, P5, and P6, and persons of ordinary skill in the art understand how to select transistors with appropriate properties to achieve desired values for the currents produced thereby. Nevertheless, as the value of I1 increases, the values of I2, I3, and I4 also increase. Put another way, the values of I2, I3, and I4 are proportional to the value of I1, and the value of I1 is inversely proportional to the value of Vcom. Thus, as Vcom changes, the values of I1, I2, I3, and I4 change inversely.

Circuit 250 provides a first current path from the VDD rail through transistor P5 and transistor P1 to ground. Similarly, there is another current path from the VDD rail through P6 and P2 to ground.

The current I3 experiences voltage drops across both P5 and P1. It is these voltage drops that determine a voltage at output node 208a. Current I4 also experiences voltage drops across transistors P6 and P2 and thus determines the voltage at output node 208b. The level-shifted common mode voltage is the common mode voltage present in the differential signal at the output nodes 208. It is not expected that the input common mode voltage Vcom should vary substantially, at least during steady state operation. But to the extent that there is variation in the common mode voltage Vcom, the current sources and the threshold voltage circuit 206 stabilize the level-shifted common mode voltage through the corresponding adjustment of I3 and I4. Therefore, circuit 250 provides a stable level-shifted common mode voltage at output nodes 208.

During high-frequency operation, the AC portion of the differential signal (the portion carrying information) passes through shunt capacitors C1 and C2. Thus, the AC portion modulates the voltage at output nodes 208, and the information in the differential signal is perceptible to a circuit (not shown) receiving the output signal from threshold voltage circuit 206.

Note that as the AC frequency drops in the differential signal, the shunt capacitors C1 and C2 become less and less useful for passing the AC portion because the impedance of a capacitor increases as frequency decreases. However, circuit 250 includes techniques to pass the AC portion to the output nodes 208 even at lower frequencies. Specifically, and as noted above, the differential signal plus and minus components (rxinp and rxinn) are input to the gates of transistors P1 and P2, respectively. In this case, P1 and P2 then act as source followers so that the voltage at their sources (output nodes 208) is modulated by the AC portion of the signal. Therefore, the AC portion of the differential signal is preserved over a wide range of frequencies, just as a stable and elevated common mode voltage is produced at the sources of P1 and P2 through the feed-forward control of P5 and P6.

Figure 3:
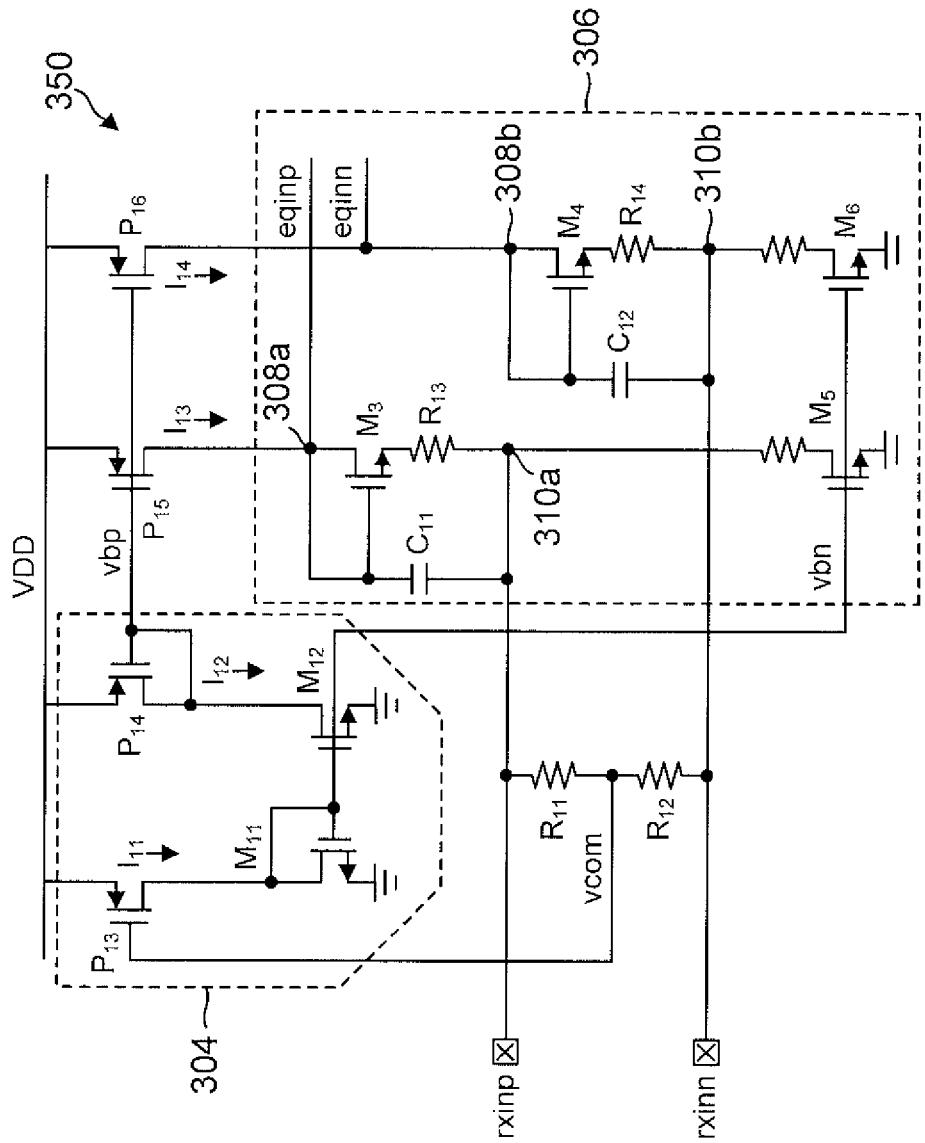
FIG. 3 illustrates another example architecture for a common mode voltage level shifting circuit in accordance with an embodiment of the disclosure.

FIG. 3 illustrates level shifting circuit 350 adapted according to one embodiment. In contrast to the embodiment of FIG. 2, the embodiment of FIG. 3 uses NMOS transistors in its threshold voltage circuit 306. Otherwise, operation of the embodiment of FIG. 3 is analogous to the operation of the embodiment of the FIG. 2. Circuit 350 may be used as a level shifting circuit 110 in the architecture of FIG. 1.

FIG. 3 includes current source 304, which receives the input common mode voltage Vcom from the voltage divider formed of R11 and R12. Current source 304 operates similarly to current source 204 (FIG. 2), described above. For instance, as Vcom decreases, the current I11 through PMOS transistor P13 and NMOS transistor M11 increases. As Vcom increases, the current I11 through transistors P13 and M11 decreases. Current I11 is mirrored by current I12, which passes through transistors P14 and M12.

The gates of transistors P15 and P16 are both connected to the gate of transistor P14. Thus, by virtue of feed-forward control, current I11 is mirrored at transistors P15 and P16 through currents I13 and I14, respectively. As Vcom changes over time, currents I13 and I14 change inversely.

Threshold voltage circuit 306 includes NMOS transistors M3 and M4. Transistor M3 receives the plus component rxinp of the differential signal at its drain through shunt capacitor C11. The plus component rxinp is also applied at resistor R13, which affects the response of transistor M3 as well.

Similarly, transistor M4 receives the minus component rxinn of the differential signal at its drain through shunt capacitor C12. The minus component rxinn is applied at resistor R14, which affects the response of the transistor M4.

The sources of M3 and M4 are isolated from ground through biasing transistors M5 and M6, respectively, whose gates are controlled by the gate voltage of M11. Generally, as I11 increases, current through transistors M5 and M6 increases as well.

Circuit 350 provides a current path for I13, as shown, through transistors P15 and M5 as current I13 goes from VDD to ground. Current I13 experiences voltage drops at each of transistors P15 and M5, and it is these voltage drops that determine the voltage at output node 308a.

Current I14 also experiences voltage drops at transistors P16 and M6 between VDD and ground. It is these voltage drops that determine the voltage at output node 308b. The level-shifted common mode voltage at output nodes 308 is the common mode voltage of the differential signal having plus and minus components eqinp and eqinn.

As noted above, large changes in the input common mode voltage Vcom are generally not expected during steady state operation. Nevertheless, the level-shifted output voltage at output nodes 308 is produced in a stable manner by the inverse feed-forward relationship of currents I13 and I14 to the input common mode voltage Vcom. In the embodiments of FIG. 2 and FIG. 3, some applications may include setting the level-shifted common mode voltage at VDD/2 during steady state operation. A person of ordinary skill in the art will understand to select transistors P15, P16, M3, M4, M5, M6 (as well as the various resistors) so that the resistor divider properties of the current paths of currents I13 and I14 drop the voltage by one-half at output nodes 308. In such a manner, the voltages at output nodes 308 stably corrects to VDD/2.

Of course, a level-shifted common mode voltage of VDD/2 is merely an example, and other embodiments may include any appropriate level-shifted common mode voltage. Other level-shifted common mode voltages may be produced by designing circuits 250 (FIG. 2) and 350 (FIG. 3) so that the voltage drops at output nodes 208 and 308, respectively, have a desired voltage.

Returning to the AC component of the differential signal, during high-frequency operation, the AC portion of the differential signal passes through shunt capacitors C11 and C12 without appreciable attenuation. Thus, the AC portion modulates the voltage at output nodes 308, and the information in the differential signal is perceptible to a circuit (not shown) receiving the output signal from threshold voltage circuit 306.

But as the AC frequency drops in the differential signal, attenuation at capacitors C11 and C12 of the AC portion increases (because of increased impedance of capacitors as frequency decreases). The circuit of FIG. 3 also provides the input differential signal to nodes 310. As shown in FIG. 3, plus component rxinp is applied to node 310a, which is separated from the source of transistor M3 by resistor R13. Thus, the AC signal of component rxinp modulates the voltage at node 308a. Similarly, minus component rxinn is applied to node 310b and thereby modulates the voltage seen at node 308b. Therefore, the AC portion of the differential signal is preserved over a wide range of frequencies, just as a stable and elevated common mode voltage is produced at the drains of M3 and M4 through the feed-forward control of P15 and P16.

Example methods of use for circuits 250 and 350 will now be discussed.

Example Methods of Use

Figure 4:
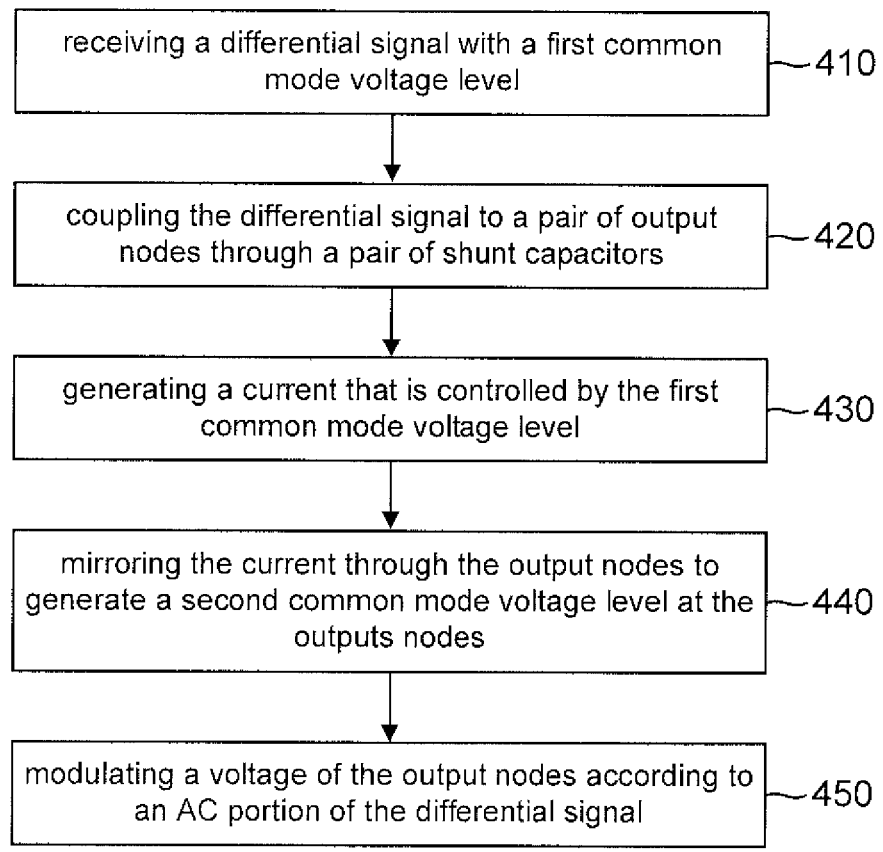
FIG. 4 illustrates a flowchart of an example method of use for the system of FIGS. 2 and 3 in accordance with an embodiment of the disclosure.

A flow diagram for an example method 400 of use of a common mode voltage level shifter of FIGS. 2 and 3 is shown in FIG. 4. The method begins in a block 410, which includes receiving a differential signal with a first common mode voltage level.

In the examples of FIGS. 2 and 3, the received differential signal includes a common mode voltage that is relatively low, and the circuit shifts the common mode voltage level up to another level. The differential signal also includes an AC portion that carries information. A circuit downstream (not shown) may receive the AC portion and detect bits or perform other processing thereon.

At block 420, the differential signal is coupled to a pair of output nodes through a pair of shunt capacitors. In the embodiments of FIG. 2, the differential signal is coupled to the sources of transistors P1 and P2 through capacitors C1 and C2. In the embodiment of FIG. 3, the differential signal is coupled to the drains of transistors M3 and M4 through capacitors C11 and C12. Capacitors block Direct Current (DC) components of signals and, thus, the shunt capacitors block the received common mode voltage of the input differential signal.

At high frequencies, the AC portion of the differential signal is passed to the output nodes, as explained in more detail below with respect to block 450.

At block 430, the circuit generates a current that is driven by the first common mode voltage level. In the embodiments of FIGS. 2 and 3, the common mode voltage level of the input differential signal (Vcom) is detected by a resistor divider circuit and passed to a current generator.

Various embodiments may use any appropriate current generator to produce the current of block 430. For instance, the embodiments of FIGS. 2 and 3 employ a current source in which the gate of a PMOS transistor is coupled to the Vcom signal. As Vcom increases, current at the current source decreases (and vice versa). Thus, in the embodiments described above, the current generated at block 430 is controlled in an inverse relationship with respect to the first common mode voltage.

At block 440, the current produced at block 430 is mirrored through the output nodes to generate a second common mode voltage at the output nodes. In the embodiments of FIGS. 2 and 3, feed-forward control is accomplished by tying the gates of transistors together. Thus, the voltage at a gate of a transistor in the current source is applied to the gate of a transistor coupled to a first output node. As current increases through the current source, the above-mentioned gate coupling causes current to increase through the transistor coupled to the first output node.

The voltage at the transistor gate in the current source is also applied to the gate of a transistor coupled to a second output node. As current increases through the current source, current increases through the transistor coupled to the second output node.

Currents, controlled by the current source and in response to the first common mode voltage, are produced at block 440. The first and second output nodes are placed within the circuit so that voltage drops along the respective current paths result in desired voltages at the output nodes. In some embodiments, the common mode voltage at the output nodes is somewhere between ground and VDD, and the common mode voltage can be produced with a high degree of stability at the output nodes by virtue of the current mirroring of block 440.

At block 450, the circuit modulates a voltage of the output nodes according to an AC portion of the differential signal. As explained above at block 420, the input differential signal is coupled to the output nodes via the pair of shunt capacitors. When the AC signal is at a high frequency, the AC signal passes through the shunt capacitors relatively unattenuated.

By contrast, when the AC signal is a relatively low frequency, the impedance of the shunt capacitors is high. The embodiment of FIG. 2 modulates the voltage of the output nodes by applying the differential signal to gates of a pair of transistors at the output nodes. The embodiment of FIG. 3 modulates the voltage of the output nodes by applying the differential signal to sources of a pair of transistors at the output nodes. Thus, various embodiments apply the differential signal to ports of output transistors to preserve the AC signal's information even at lower frequencies.

The scope of embodiments is not limited to the specific method shown in FIG. 4. Other embodiments may add, omit, rearrange, or modify one or more actions. For instance, in many real-world applications, the actions of blocks 410-450 are not performed in series, but rather are performed concurrently as the level shifting circuit operates. Also, the actions of blocks 410-450 are performed continuously as the circuit receives a first common mode voltage level and outputs another common mode voltage level.

Furthermore, various embodiments may perform other actions as well. For instance, other circuits downstream may receive the level-shifted differential signal and detect a binary voltage level therefrom. Bit detection may be performed in any appropriate manner, e.g., by conventional bit-detection processes and is not discussed further herein.

As those of some skill in this art will by now appreciate and depending on the particular application at hand, many modifications, substitutions and variations can be made in and to the materials, apparatus, configurations and methods of use of the devices of the present disclosure without departing from the spirit and scope thereof. In light of this, the scope of the present disclosure should not be limited to that of the particular embodiments illustrated and described herein, as they are merely by way of some examples thereof, but rather, should be fully commensurate with that of the claims appended hereafter and their functional equivalents.

What is claimed is:

1. A common mode voltage level shifting circuit, comprising:
   input nodes configured to receive a differential signal with a first common mode voltage;
   a pair of shunt capacitors coupled between the input nodes and a corresponding pair of output nodes;
   a threshold voltage circuit, including the output nodes, coupled to the differential signal though the shunt capacitors, the threshold voltage circuit configured to provide a second common mode voltage for the differential signal at the output nodes; and
   current sources that are controlled according to a level of the first common mode voltage, the current sources coupled to the output nodes to effect the second common mode voltage.

2. The common mode voltage level shifting circuit of claim 1, wherein the current sources are inversely controlled with respect to the level of the first common mode voltage.

3. The common mode voltage level shifting circuit of claim 1, wherein the current sources are controlled in a feed-forward manner by another current source that receives the first common mode voltage.

4. The common mode voltage level shifting circuit of claim 1, wherein the threshold voltage circuit comprises:
   a first transistor coupled to a first component of the differential signal at its gate through a first one of the shunt capacitors, a drain of the first transistor being a first one of the output nodes; and
   a second transistor coupled to a second component of the differential signal at its gate through a second one of the shunt capacitors, a drain of the second transistor being a second one of the output nodes, wherein the first component of the differential signal modulates a voltage of the first one of the output nodes through a source of the first transistor, and further wherein the second component of the differential signal modulates a voltage of the second one of the output nodes through a source of the second transistor.

5. The common mode voltage level shifting circuit of claim 4, wherein the threshold voltage circuit further comprises:
a first biasing transistor disposed between the first transistor and ground, the first biasing transistor configured to provide a voltage drop between the first transistor and ground; and
a second biasing transistor disposed between the second transistor and ground, the second biasing transistor configured to provide a voltage drop between the second transistor and ground.

6. The common mode voltage level shifting circuit of claim 1, wherein the threshold voltage circuit comprises:
a first transistor coupled to a first component of the differential signal at its gate, a source of the first transistor being a first one of the output nodes; and
a second transistor coupled to a second component of the differential signal at its gate, a source of the second transistor being a second one of the output nodes, wherein the first component of the differential signal modulates a voltage of the first one of the output nodes, and further wherein the second component of the differential signal modulates a voltage of the second one of the output nodes.

7. The common mode voltage level shifting circuit of claim 6, wherein the output nodes are coupled by the shunt capacitors to the gates of the first and second transistors.

8. The common mode voltage level shifting circuit of claim 1, wherein the current sources comprise:
a first current source configured to drive a first one of the output nodes, the first current source controlled by, and coupled to, an input transistor having its gate tied to the first common mode voltage; and
a second current source configured to drive a second one of the output nodes, the second current source controlled by, and coupled to, the input transistor.

9. The common mode voltage level shifting circuit of claim 8, wherein the input transistor is included in a current mirror, the current mirror configured to produce a first current that controls a current at the first current source and a current at the second current source.

10. The common mode voltage level shifting circuit of claim 8, wherein the first current source comprises a transistor having its gate coupled to the gate of the input transistor, further wherein the second current source comprises a transistor having its gate coupled to the gate of the input transistor.

11. A method for shifting a common mode voltage level, the method comprising:
receiving a differential signal with a first common mode voltage level;
coupling the differential signal to a pair of output nodes through a pair of shunt capacitors;
generating a current that is controlled by the first common mode voltage level; and
mirroring the current through the output nodes to generate a second common mode voltage level at the output nodes.

12. The method of claim 11, wherein the current is inversely proportional to the first common mode voltage level.

13. The method of claim 11, further comprising:
driving gates of a pair of PMOS transistors with the differential input signal, a first component of the differential signal coupled to a source of a first one of the PMOS transistors through a first one of the shunt capacitors, a second component of the differential signal coupled to a source of a second one of the PMOS transistors through a second one of the shunt capacitors.

14. The method of claim 13, wherein the sources of the PMOS transistors comprise the output nodes.

15. The method of claim 11, further comprising:
driving sources of a pair of NMOS transistors with the differential input signal, a first component of the differential input signal coupled to a drain of a first one of the NMOS transistors through a first one of the shunt capacitors, a second component of the differential signal coupled to a drain of a second one of the NMOS transistors through a second one of the shunt capacitors.

16. The method of claim 14, wherein the drains of the NMOS transistors comprise the output nodes.

17. The method of claim 11, further comprising:
modulating a voltage of the output nodes by applying the differential signal to gates of a pair of transistors at the output nodes.

18. The method of claim 11, further comprising:
modulating a voltage of the output nodes by applying the differential signal to sources of a pair of transistors at the output nodes.

19. A common mode voltage level shifting circuit, comprising:
input nodes configured to receive a differential signal with a first common mode voltage;
a pair of shunt capacitors coupling the differential signal to output nodes of the circuit;
a threshold voltage circuit, including the output nodes, configured to receive the differential signal though the shunt capacitors, the threshold voltage circuit configured to provide a second common mode voltage for the differential signal at the output nodes; and
means for driving the output nodes to effect the second common mode voltage, the driving means being controlled according to a level of the first common mode voltage.

20. The common mode voltage level shifting circuit of claim 19, wherein the driving means are inversely controlled with respect to the level of the first common mode voltage.

21. The common mode voltage level shifting circuit of claim 19, wherein the driving means comprise current sources that are controlled in a feed-forward manner by another current source that receives the first common mode voltage.

22. The common mode voltage level shifting circuit of claim 19, wherein the threshold voltage circuit comprises:
a first transistor coupled to a first component of the differential signal at its gate through a first one of the shunt capacitors, a drain of the first transistor being a first one of the output nodes; and
a second transistor coupled to a second component of the differential signal at its gate through a second one of the shunt capacitors, a drain of the second transistor being a second one of the output nodes, wherein the first component of the differential signal modulates a voltage of the first one of the output nodes through a source of the first transistor, and further wherein the second component of the differential signals modulates a voltage of the second one of the output nodes through a source of the second transistor.

23. The common mode voltage level shifting circuit of claim 22, wherein the threshold voltage circuit further comprises:

a first biasing transistor disposed between the first transistor and ground, the first biasing transistor configured to produce a voltage drop between the first transistor and ground; and a second biasing transistor disposed between the second transistor and ground, the second biasing transistor configured to produce a voltage drop between the second transistor and ground.

24. The common mode voltage level shifting circuit of claim 19, wherein the threshold voltage circuit comprises:

a first transistor coupled to a first component of the differential signal at its gate, a source of the first transistor being a first one of the output nodes; and a second transistor coupled to a second component of the differential signal at its gate, a source of the second transistor being a second one of the output nodes, wherein the first component of the differential signal modulates a voltage of the first one of the output nodes, and further wherein the second component of the differential signals modulates a voltage of the second one of the output nodes.

25. The common mode voltage level shifting circuit of claim 19, wherein the means for driving comprise:

a first current source configured to drive a first one of the output nodes, the first current source controlled by, and coupled to, an input transistor having its gate tied to the first common mode voltage; and a second current source configured to drive a second one of the output nodes, the second current source controlled by, and coupled to, the input transistor.

26. The common mode voltage level shifting circuit of claim 25, wherein the input transistor is included in a current mirror, the current mirror configured to produce a first current that controls a current at the first current source and a current at the second current source.

27. The common mode voltage level shifting circuit of claim 25, wherein the first current source comprises a transistor having its gate coupled to the gate of the input transistor, further wherein the second current source comprises a transistor having its gate coupled to the gate of the input transistor.

28. A data receiver circuit comprising:

first circuitry configured to receive a differential signal having a first common mode voltage level;

a level-shifting component coupled to the first circuitry, the level shifting component including: a current source configured to produce a current inversely related to the first common mode voltage and configured to drive the current to output nodes of the level-shifting component, a pair of shunt capacitors coupling the differential signal to the output nodes, a pair of transistors in communication with the shunt capacitors, each of the transistors configured to receive a respective component of the differential signal and current from the current source, wherein respective voltage drops at each of the transistors defines a second common mode voltage level; and second circuitry in communication with the output nodes of the level shifting component, the second circuitry configured to receive a modified version of the differential signal at the second common mode voltage level.

29. The data receiver circuit of claim 28, wherein:

the first transistor configured to receive a first component of the differential signal at its gate through a first one of the shunt capacitors, a drain of the first transistor being a first one of the output nodes; and the second transistor configured to receive a second component of the differential signal at its gate through a second one of the shunt capacitors, a drain of the second transistor being a second one of the output nodes, wherein the first component of the differential signal modulates a voltage of the first one of the output nodes, and further wherein the second component of the differential signals modulates a voltage of the second one of the output nodes.

30. The data receiver circuit of claim 28, wherein the threshold voltage circuit comprises:

the first transistor configured to receive a first component of the differential signal at its gate, a source of the first transistor being a first one of the output nodes; and the second transistor configured to receive a second component of the differential signal at its gate, a source of the second transistor being a second one of the output nodes, wherein the first component of the differential signal modulates a voltage of the first one of the output nodes, and further wherein the second one of the differential signals modulates a voltage of the second component of the output nodes.

* * * * *